(12) United States Patent
Ikushima

(10) Patent No.: US 8,288,173 B2
(45) Date of Patent: Oct. 16, 2012

(54) METHOD, APPARATUS AND PROGRAM FOR FILLING LIQUID MATERIAL

(75) Inventor: Kazumasa Ikushima, Mitaka (JP)

(73) Assignee: Musashi Engineering, Inc., Mitaka-shi, Tokyo (JP)

( * ) Notice: Subject to any disclaimer, the term of this patent is extended or adjusted under 35 U.S.C. 154(b) by 665 days.

(21) Appl. No.: 12/513,250

(22) PCT Filed: Nov. 1, 2007

(86) PCT No.: PCT/JP2007/071292
§ 371 (c)(1),
(2), (4) Date: May 1, 2009

(87) PCT Pub. No.: WO2008/053952
PCT Pub. Date: May 8, 2008

(65) Prior Publication Data
US 2010/0075021 A1    Mar. 25, 2010

(30) Foreign Application Priority Data

Nov. 1, 2006   (JP) ................... 2006-298238

(51) Int. Cl.
*H01L 21/00*        (2006.01)
(52) U.S. Cl. ............................. 438/5; 438/108
(58) Field of Classification Search .................. None
See application file for complete search history.

(56) References Cited

U.S. PATENT DOCUMENTS

| | | | |
|---|---|---|---|
| 5,052,338 A * | 10/1991 | Maiorca et al. | 118/668 |
| 5,141,165 A * | 8/1992 | Sharpless et al. | 239/752 |
| 5,817,545 A * | 10/1998 | Wang et al. | 438/127 |
| 5,857,589 A * | 1/1999 | Cline et al. | 222/1 |
| 5,906,682 A * | 5/1999 | Bouras et al. | 118/712 |
| 6,173,864 B1 * | 1/2001 | Reighard et al. | 222/55 |
| 6,447,847 B1 * | 9/2002 | Hynes et al. | 427/427.2 |
| 6,541,063 B1 * | 4/2003 | Prentice et al. | 427/8 |
| 6,541,304 B1 * | 4/2003 | Bouras et al. | 438/108 |
| 6,814,810 B2 * | 11/2004 | Prentice et al. | 118/677 |

(Continued)

FOREIGN PATENT DOCUMENTS

EP   1479451 A2 * 11/2004

(Continued)

OTHER PUBLICATIONS

International Search Report of PCT/JP2007/071292, date of mailing Feb. 5, 2008.

*Primary Examiner* — David E Graybill
(74) *Attorney, Agent, or Firm* — Westerman, Hattori, Daniels & Adrian, LLP

(57) ABSTRACT

Provided are a method, an apparatus and a computer program for filling a liquid material, which do not require complicated parameter calculation and which do not affect the moving speed of a discharge unit. In the method for filling a gap between a substrate and a work placed thereon with the liquid material discharged from the discharge unit by utilizing a capillary action, the method is characterized in forming an application pattern made up of an application region and a non-application region along an outer periphery of the work, and correcting a discharge amount of the liquid material by extending and contracting the application region and the non-application region. The apparatus and the program for carrying out the method are also provided.

19 Claims, 8 Drawing Sheets

U.S. PATENT DOCUMENTS

| | | | |
|---|---|---|---|
| 6,955,946 B2 * | 10/2005 | Bouras et al. | 438/108 |
| 7,843,074 B2 * | 11/2010 | Gao et al. | 257/779 |
| 7,939,125 B2 * | 5/2011 | Abernathy et al. | 427/8 |
| 2003/0077852 A1 * | 4/2003 | Master et al. | 438/106 |
| 2003/0137080 A1 * | 7/2003 | Bouras et al. | 264/272.11 |
| 2004/0186621 A1 * | 9/2004 | Lewis et al. | 700/240 |
| 2005/0001869 A1 * | 1/2005 | Abernathy et al. | 347/17 |
| 2005/0003580 A1 * | 1/2005 | Arai et al. | 438/109 |
| 2005/0095366 A1 * | 5/2005 | Fang et al. | 427/421.1 |
| 2005/0095367 A1 * | 5/2005 | Babiarz et al. | 427/421.1 |
| 2005/0275091 A1 * | 12/2005 | Boyaud et al. | 257/731 |
| 2006/0029724 A1 * | 2/2006 | Babiarz et al. | 427/64 |
| 2007/0000603 A1 * | 1/2007 | Babiarz et al. | 156/291 |
| 2007/0069041 A1 * | 3/2007 | Quinones et al. | 239/71 |
| 2008/0061312 A1 * | 3/2008 | Gao et al. | 257/99 |
| 2010/0052198 A1 * | 3/2010 | Ikushima | 264/40.4 |
| 2010/0075021 A1 * | 3/2010 | Ikushima | 427/9 |

FOREIGN PATENT DOCUMENTS

| | | | |
|---|---|---|---|
| JP | 4-200671 A | | 7/1992 |
| JP | 11-97829 A | | 4/1999 |
| JP | 2001137756 A | * | 5/2001 |
| JP | 2002-303275 | | 10/2002 |
| JP | 2004-344883 A | | 12/2004 |

* cited by examiner

METHOD, APPARATUS AND PROGRAM FOR FILLING LIQUID MATERIAL

TECHNICAL FIELD

The present invention relates to a method, an apparatus and a program for filling a gap between a substrate and a work placed thereon with a liquid material discharged from a discharge unit by utilizing a capillary action. More particularly, the present invention relates to a method, an apparatus and a program, which can correct a discharge amount of the liquid material, especially in an underfill process for semiconductor packaging, without requiring complicated parameter calculations.

The term "discharge" used in the present invention includes discharge of the type that a liquid material comes into contact with a work before the liquid material departs from a discharge unit, and discharge of the type that a liquid material comes into contact with a work after the liquid material has departed from a discharge unit.

BACKGROUND ART

In step with downsizing and higher performance of electronic equipment, the packaging technique called the flip-chip method has recently received attention in order to satisfy demands for packaging of semiconductor parts at a higher density and an increase in the number of pins of each semiconductor part. The packaging using the flip-chip method is performed by forming salient electrodes (bumps) on electrode pads which are present on the surface of a semiconductor chip, and by directly joining the bumps to corresponding electrode pads on a substrate positioned to face the semiconductor chip. Using the flip-chip method is advantageous in that an area required for the packaging is substantially equal to the area of the semiconductor chip and the packaging can be achieved with a higher density. Further, the flip-chip method is suitably adaptable for an increase in the number of pins because the electrode pads can be arranged over the entire surface of the semiconductor chip. Still other advantages are that the length of each connecting wire is just required to cover the height of the bump electrode, thus ensuring good electrical characteristics, and that a surface of the semiconductor chip on the side opposite to a connected portion thereof is exposed, thus ensuring more efficient heat radiation.

In a flip-chip package, a resin is filled into a gap between the semiconductor chip and the substrate to reinforce the connected portion so that stresses generated due to the difference in thermal expansion coefficient between the semiconductor chip and the substrate are prevented from concentrating in the connected portion and breaking the connected portion. Such a process is called "underfill" (see FIG. 1).

The underfill process is performed by applying a liquid resin along an outer periphery (e.g., one or two sides) of the semiconductor chip, filling the applied resin into the gap between the semiconductor chip and the substrate by utilizing a capillary action, and by hardening the resin under heating in an oven, for example.

In the underfill process, a change in viscosity of the resin material over time has to be taken into consideration. This is because an increase of viscosity causes the problem that the amount of the resin material discharged through a material discharge port is reduced and the capillary action becomes insufficient, thus making the resin material hard to be filled into the gap in a proper amount. In the case of the resin material exhibiting a large viscosity change, a discharge amount of the resin material is reduced, for example, 10% or more after the lapse of 6 hours. This means the necessity of correcting the change in the discharge amount, which is attributable to the viscosity change over time.

Generally, a dispenser is used to fill the resin material in the underfill process. As one type of the dispenser, there is known a jet type dispenser which jets out small droplets of the liquid material through a nozzle.

A method of performing the underfill process by using the jet type dispenser is disclosed in, e.g., Japanese Patent Laid-Open No. 2004-344883 (Patent Document 1). More specifically, Patent Document 1 discloses a method of discharging a viscous material onto a substrate by using a jet type dispenser, the method including the steps of preparing a total volume of the viscous material to be discharged and a length over which the total volume of the viscous material is to be discharged, performing an operation to apply a plurality of viscous material liquid droplets onto a weight scale, generating a feedback signal representing the weight of the plurality of viscous material liquid droplets having been applied onto the weight scale, and determining a maximum relative speed between the dispenser and the substrate such that the total volume of the viscous material is discharged over the prepared length.

Also, Patent Document 1 discloses a method further including the steps of determining respective volumes of the plurality of viscous material liquid droplets, determining a total number of liquid droplets required to provide a volume substantially equal to the total volume, determining a distance between the liquid droplets, which is required to substantially evenly distribute the viscous material liquid droplets over the length, and determining a maximum relative speed between the dispenser and the substrate such that the total number of the viscous material liquid droplets are substantially evenly discharged over the length.

Patent Document 1: Japanese Patent Laid-Open No. 2004-344883

DISCLOSURE OF THE INVENTION

Problems to be Solved by the Invention

However, the method disclosed in Patent Document 1 requires procedures for determining the number of liquid droplets and the interval between adjacent liquid droplets so that the viscous material is evenly discharged over the length. Various parameters have to be calculated in those procedures, and many errors are caused during the calculations.

Also, to more exactly achieve evener discharge, the size of each liquid droplet has to be made uniform and a special means is required for that purpose.

Further, the maximum relative speed between the nozzle (discharge unit) and the substrate is changed such that, when the viscosity increases, the speed is changed in a direction toward a lower speed. The speed-down raises the problem that an application time is prolonged and productivity is adversely affected.

Accordingly, an object of the present invention is to solve the above-described problems and to provide a method, a device and a program for filling a liquid material, which neither require complicated parameter calculations, nor cause an adverse influence on a moving speed of a discharge unit.

Means for Solving the Problems

As methods for correcting a discharge amount of the liquid material in a state where an application speed is held constant, it is conceivable to hold constant the amount of the liquid material discharged from a discharge unit per unit time by controlling a pressurization level, a plunger stroke, a valve reciprocating speed, etc. However, those methods require various parameters to be determined by calculations and hence accompany with a risk that many errors are caused during the calculations. In view of that problem, the inventor has made intensive endeavors and has accomplished the present invention with intent to simplify the correction procedures.

In more detail, the present invention according to a first aspect provides a method for filling a gap between a substrate and a work placed thereon with a liquid material discharged from a discharge unit by utilizing a capillary action, the method comprising the steps of preparing an application pattern which is extended along an outer periphery of the work and which is made up of an application region and a non-application region, and correcting a discharge amount of the liquid material by extending and contracting the application region and the non-application region.

According to a second aspect of the present invention, in the liquid material filling method according to the first aspect, the application region and the non-application region are extended and contracted without changing a total length of the application pattern.

According to a third aspect of the present invention, in the liquid material filling method according to the first or second aspect, the application pattern includes the application region and the non-application region which are alternately continuously extended.

According to a fourth aspect of the present invention, in the liquid material filling method according to the first, second or third aspect, the application pattern has a total length substantially equal to one side of a square work and is made up of one or more application regions and a plurality of non-application regions adjacent to the one or more application regions.

According to a fifth aspect of the present invention, in the liquid material filling method according to the first, second or third aspect, the application pattern is made up of an application region having a length substantially equal to one side of a square work and one or two non-application regions which are adjacent to the application region and which are set to extend along a side of the work adjacent to the aforesaid side thereof.

According to a sixth aspect of the present invention, in the liquid material filling method according to the first, second or third aspect, wherein the application pattern is made up of an application region having a length substantially equal to one side of a square work and one or two non-application regions which are adjacent to the application region and which are set parallel to each other.

According to a seventh aspect of the present invention, in the liquid material filling method according to the first to sixth aspects, wherein a moving speed (V) of a discharge unit is not changed between before and after the discharge amount is corrected.

According to an eighth aspect of the present invention, the liquid material filling method according to the first to seventh aspects further comprises the steps of measuring weight ($W_1$) of the liquid material discharged during a discharge time ($T_1$) before correction, calculating a time ($T_2$) required to discharge the liquid material in proper weight ($W_2$) based on a relationship between the discharge time ($T_1$) and the weight ($W_1$), calculating a proper total length ($L_2$) of the application region from the time ($T_2$) and a moving speed (V) of the discharge unit, and setting a difference between the calculated proper total length ($L_2$) of the application region and a total length ($L_1$) of the application region before the correction as extension/contraction amounts of respective total lengths of the application region and the non-application region.

According to a ninth aspect of the present invention, the liquid material filling method according to the first to seventh aspects further comprises the steps of discharging the liquid material and measuring a time ($T_2$) until reaching proper weight ($W_2$), calculating a proper total length ($L_2$) of the application region from the time ($T_2$) and a moving speed (V) of the discharge unit, and setting a difference between the calculated proper total length ($L_2$) of the application region and a total length ($L_1$) of the application region before the correction as extension/contraction amounts of respective total lengths of the application region and the non-application region.

According to a tenth aspect of the present invention, the liquid material filling method according to the eighth or ninth aspect further comprises the steps of storing a relationship between a discharge time or discharge weight and viscosity of the liquid material in a memory, and in a step after replacing the liquid material, calculating the extension/-contraction amounts of respective total lengths of the application region and the non-application region based on information stored in the memory.

According to an eleventh aspect of the present invention, the liquid material filling method according to the eighth, ninth or tenth aspect further comprises the steps of preparing an allowable range used for making determination as to whether the correction is to be performed, and changing the extension/contraction amounts of respective total lengths of the application region and the non-application region for the correction when a measured value exceeds the allowable range.

According to a twelfth aspect of the present invention, the liquid material filling method according to the first to eleventh aspects further comprises the step of correcting the discharge amount depending on a change in viscosity of the liquid material over time.

According to a thirteenth aspect of the present invention, in the liquid material filling method according to the first to twelfth aspects, the discharge amount is corrected based on time information input as a correction period by a user, the number of works, or the number of substrates.

A fourteenth aspect of the present invention provides an application apparatus comprising a liquid material supply unit for supplying a liquid material to be discharged, a measuring unit for measuring a discharge amount of the liquid material, a discharge unit having a discharge port to discharge the liquid material, a driving unit capable of moving the discharge unit, and a control unit for controlling operations of the aforesaid units, wherein the control unit incorporates a computer program for carrying out the liquid material applying method according to any one of the first to thirteenth aspects.

A fifteenth aspect of the present invention provides a computer program product for use in an application apparatus comprising a liquid material supply unit for supplying a liquid material to be discharged, a measuring unit for measuring a discharge amount of the liquid material, a discharge unit having a discharge port to discharge the liquid material, a driving unit capable of moving the discharge unit, and a control unit for controlling operations of the aforesaid units, wherein the computer program product causes the control unit to carry out the liquid material filling method according to any one of the first to thirteenth aspects.

Effect of the Invention

According to the present invention, since an amount of discharged liquid material is corrected by extending and contracting an application region and a non-application region, an application pattern can be freely prepared without receiving any restriction from the necessity of evenly applying the liquid material over a total length of the application pattern.

Further, procedures are simpler and errors due to calculations are less apt to occur in comparison with the case of making correction per liquid droplet.

In addition, since the moving speed of the discharge unit is not changed, the application time is not affected.

Figure 1:
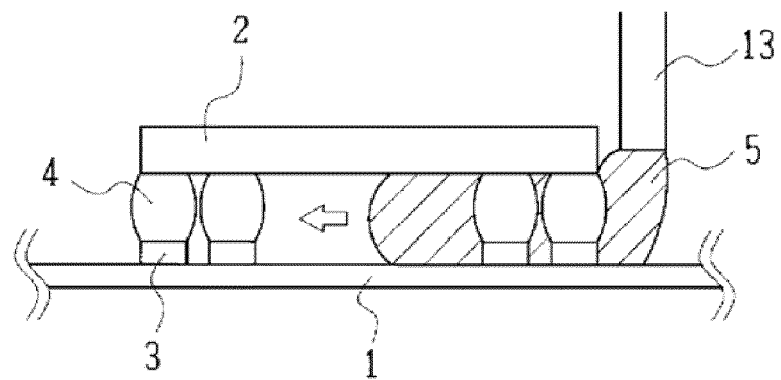
FIG. 1 is a side view to explain the underfill process.

DESCRIPTION OF REFERENCE CHARACTERS 1 substrate
2 chip
3 electrode pad
4 bump (salient electrode)
5 liquid material
6 dispenser
7 XY-driving means
8 weight scale
9 conveying means
10 flip-chip packaging substrate
11 application region
12 non-application region
13 nozzle

BEST MODE FOR CARRYING OUT THE INVENTION

The best mode for carrying out the present invention will be described below.

(1) Preparation of Application Pattern

Figure 3:
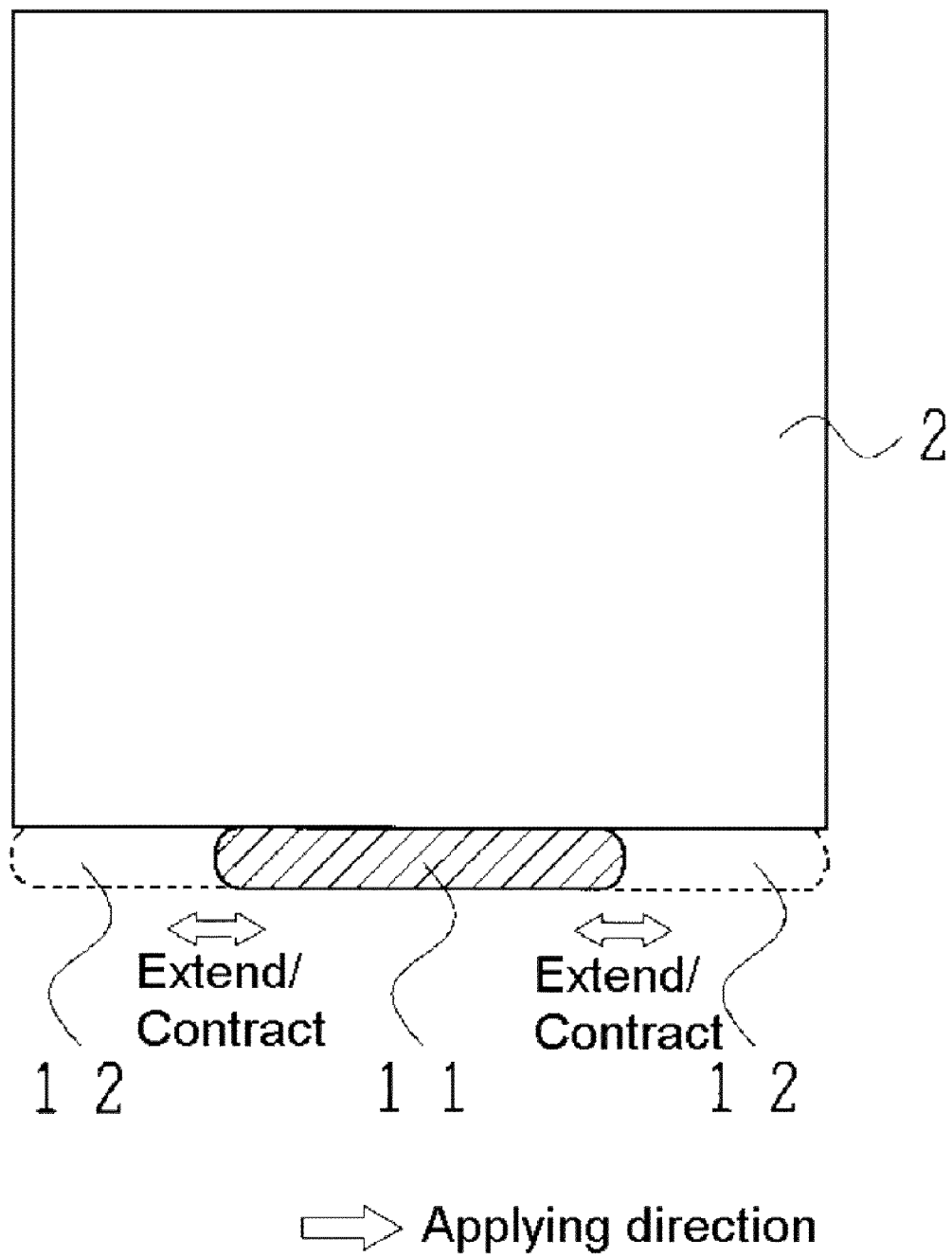
FIG. 3 is an explanatory view illustrating a first example of an application pattern.

One or plural application patterns are prepared and, in the latter case, one of the prepared patterns is selected. For example, the application pattern is prepared, as shown in FIG. 3, which is in the form of a line extending along one side of a chip 2, i.e., a square work, and which is made up of an application region 11 and non-application regions 12 alternately extending in a continuous relation. Note that the work is not limited to a square shape, and it may have a circular or polygonal shape.

The total (entire) length of the application pattern and the respective numbers of the application regions 11 and the non-application regions 12 are decided depending on, e.g., the weight or the volume of a liquid material 5, which is required to fill a gap between the chip 2 and a substrate 1. For example, when the liquid material is applied along one side of the chip 2 as shown in FIG. 3, one application pattern is constituted such that two non-application regions 12 are positioned on both sides of one application region 11.

The application region 11 is not limited to a linear region and may be in the dotted form in some cases. For example, when the chip 2 has a small size or when the yield is to be increased (i.e., when failures caused by entrainment of air bubbles are to be reduced), the liquid material 5 may be discharged to one point near the center of the relevant side, or the liquid material 5 may be discharged for a certain time while a nozzle 13 serving as a discharge unit is held standstill at one point.

(2) Setting of Initial Parameters

For the liquid material to be applied, the relationships between the application pattern and proper weight and/or a proper discharge time of the liquid material are calculated in advance based on tests and are stored in a memory of a control unit. Although a change in a discharge amount of the liquid material is affected by a change in viscosity of the liquid material caused by a temperature change, clogging in the discharge unit, and the water head difference, the change of the discharge amount can be generally handled in an adaptable manner by setting those parameters.

Also, a value calculated based on the pot life specified by the maker is preferably stored as a limit value of a time over which the liquid material is usable.

Further, when a correction amount is calculated in later-described (4), the "relationship between the discharge time and the viscosity" with the weight of discharged liquid material (discharge weight) held constant and the "relationship between the discharge weight and the viscosity" with the discharge time held constant are preferably stored in the memory of the control unit. The reason is that, in the case of using the liquid material of the same type, discharging and measuring operations for the correction are no longer required in the second and subsequent applying operations by calculating the correction amount based on data stored in the control unit.

(3) Setting of Correction Period

A correction period is set as a period defining the timing at which the application pattern is to be corrected. The correction period is set, for example, as time information entered by a user, or the number of chips 2 or substrates 1. In the case of setting a predetermined time, it is set as a time at which the change in the discharge amount of the liquid material is expected to exceed an allowable range, counting from the start of the applying operation. In the case of setting the number of chips 2 or substrates 1, it is determined and set based on a time required for processing one chip 2 or one substrate 1 (i.e., a time required for steps of carrying-in→applying→carrying-out) and the above-mentioned predetermined time.

When setting the correction period, the change in viscosity of the liquid material, which is caused with the lapse of time and by a temperature change, has to be taken into consideration. In the following, however, a description is made on the premise that the viscosity change is only caused depending on the lapse of time.

As a matter of course, the known technique for controlling the viscosity of the liquid material with temperature adjustment in the discharge unit can also be additionally used in the present invention.

(4) Calculation of Correction Amount

At the correction period thus set, the correction amount is calculated to be adapted for the change of the discharge amount, which is caused by the change in viscosity of the liquid material.

First, the nozzle 13 is moved to a location above a weight scale 8, and the liquid material is discharged in a fixed position. Then, the weight of the liquid material discharged onto a weighing portion of the weight scale 8 is read and the correction amount is determined in comparison with the parameters stored in above-described (2).

The correction amount can be calculated by a method (a) of measuring the weight of the liquid material discharged for a certain time and calculating the correction amount based on the difference between the measured weight and the proper weight, or a method (b) of measuring the discharge time taken to provide the proper weight and calculating the correction amount based on the difference between the measured discharge time and the discharge time in a just preceding cycle.

The methods (a) and (b) will be described in more detail in connection with an example of the application pattern shown in FIG. 3.

First, proper weight $W_2$ required to fill the liquid material is calculated from the size of the chip 2 and the gap between the chip 2 and the substrate 1. Then, a total length $L_1$ of the application region 11 in the application pattern is calculated from the size of the chip 2. Subsequently, a time $T_1$ required to discharge the liquid material in the proper weight $W_2$ is calculated.

While there are plural methods for calculating the time $T_1$, two typical calculation methods used in the jet type dispenser are disclosed herein. According to one method, in view of that the timing of discharging the liquid droplet from the nozzle 13 is constant, the time required to discharge the liquid material in the proper weight $W_2$ is calculated based on such timing and the weight of each droplet. According to the other method, the time is measured while actually discharging the liquid material onto the weight scale 8 until reaching the proper weight $W_2$.

Figure 7:
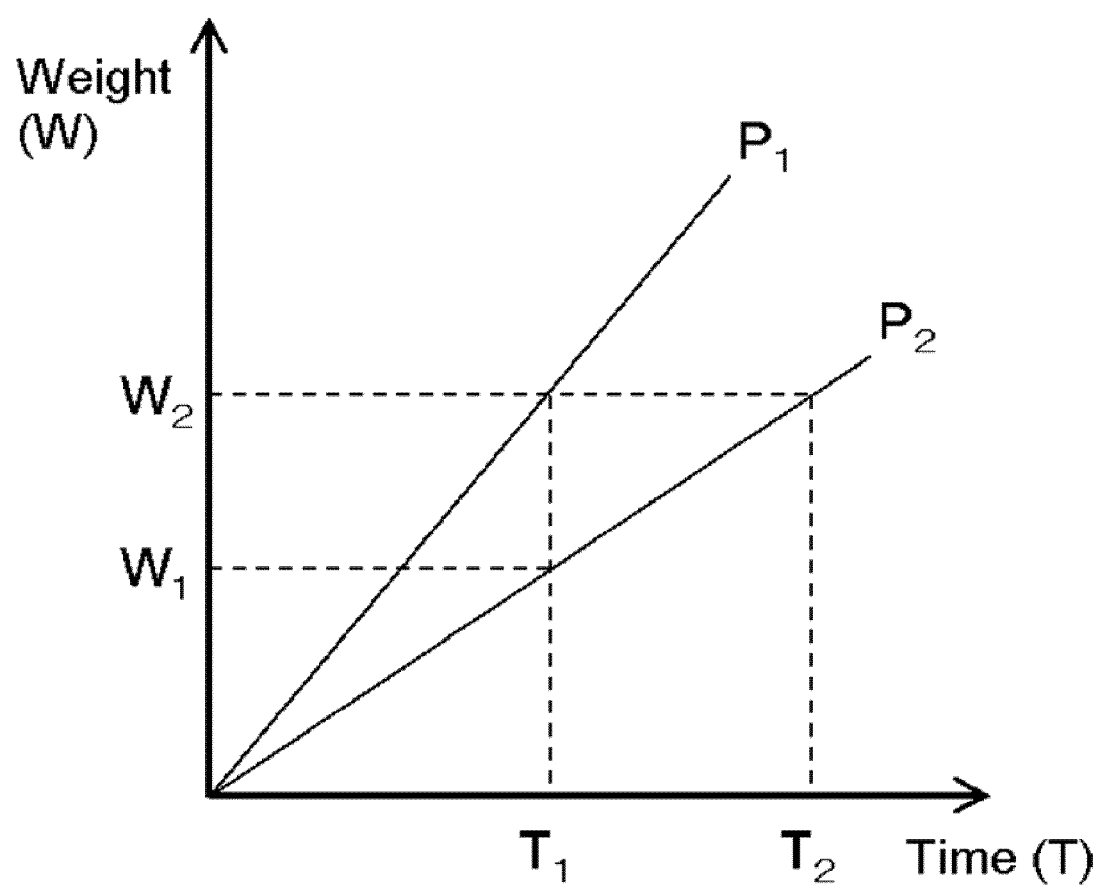
FIG. 7 is a graph to explain a correction method for the application pattern.

With reference to FIG. 7, the following description is made for a practical method for calculating the correction amount when the viscosity of the liquid material has increased ($P_1 \rightarrow P_2$). It is herein premised that a moving speed V of the nozzle 13 is constant.

In the case of the method (a), if the liquid material is discharged for the same time as the time $T_1$ with viscosity $P_2$ after the change, the value measured by the weight scale 8 becomes $W_1$. Based on the relationship between the time $T_1$ and the weight $W_1$, therefore, a time $T_2$ is calculated which is required to discharge the liquid material in the same weight as the proper weight $W_2$ with the viscosity $P_2$ after the change. Herein, $L_2$ is assumed to represent a proper length of the application region 11 resulting when the nozzle is moved at the speed V for the time $T_2$. Accordingly, an extension/contraction amount $L_3$ of the application region 11 is given by $L_2 - L_1$.

In the case of the method (b), the discharge time is changed from $T_1$ to $T_2$ by measuring the time that is required to discharge the liquid material in the same weight as the proper weight $W_2$ with the viscosity $P_2$ after the change. As mentioned above, $L_2$ is assumed to represent a proper length of the application region 11 resulting when the nozzle is moved at the speed V for the time $T_2$. Accordingly, an extension/contraction amount $L_3$ of the application region 11 is given by $L_2 - L_1$.

Instead of always performing the correction when the extension/contraction amount $L_3$ is not zero, the correction is preferably performed only when the change of the measured discharge amount (measured value) or the calculated correction amount exceeds an allowable range (e.g., ±10%). A preferred manner of the correction with setting of such an allowable range is described in detail, for example, in Japanese Patent Laid-Open No. 2001-137756 filed by the applicant. More specifically, the allowable range is set for making determination as to whether the correction is to be performed, and the application pattern is corrected only when the measured value or the correction amount (in terms of, e.g., time, weight, or extension/contraction amount) exceeds the allowable range.

(5) Correction of Application Pattern

When it is determined in the above-described step (4) that the correction of the discharge amount is required, the correction is performed by extending or contracting the length of the application region 11 and by contracting or extending the length of the non-application region 12 in the same amount as the extension/contraction amount of the application region 11.

The extension/contraction amount $L_3$ is preferably evenly distributed depending on the respective numbers of the application regions 11 and the non-application regions 12. Thus, in the case of the application pattern shown in FIG. 3, the extension/contraction amount of the application region 11 is the same as $L_3$, whereas the extension/-contraction amount of the non-application region 12 is $L_3/2$.

As described above, by executing the steps (4) and (5) at the correction period set in the step (3) or at the timing when the type (size or shape) of the substrate 1 is changed, the best application pattern can be always formed regardless of the change in viscosity of the liquid material over time.

Details of the present invention will be described below in connection with an embodiment. It is however to be noted that the present invention is in no way restricted by the following embodiment.

Embodiment

Figure 2:
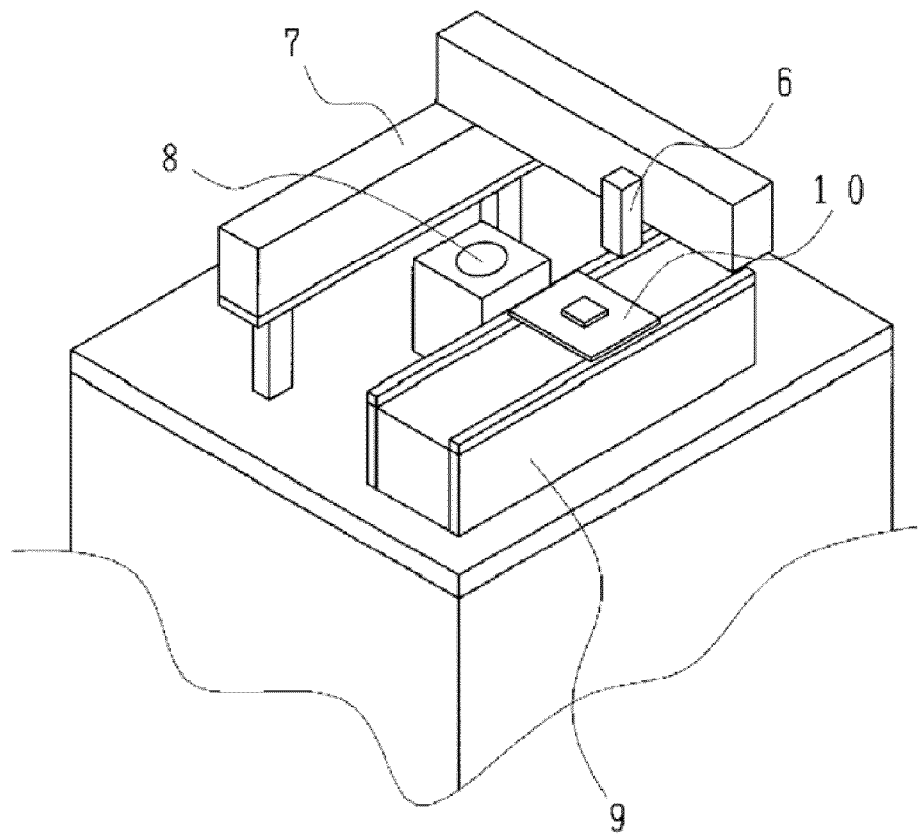
FIG. 2 is a schematic perspective view of an apparatus according to Embodiment 1.

FIG. 2 is a schematic view of an apparatus for carrying out a method according to the embodiment.

First, a flip-chip packaging substrate 10, i.e., an object onto which the liquid material is to be applied, is conveyed by a conveying means 9 to a position under a nozzle 13 for discharging the liquid material.

A dispenser 6 including the nozzle 13 is mounted to an XY-driving means 7 and is movable to a position above the substrate 10 or the weight scale 8. Also, the XY-driving means 7 can perform the operation of applying the liquid material while moving in the XY-directions above the substrate 10.

When the substrate 10 is carried to the position under the nozzle 13, the liquid material is started to be applied after proper positioning of the substrate 10. A basic application pattern providing a path, along which the nozzle 13 is moved for the applying operation, is previously stored in, e.g., a memory within a control unit (not shown) that controls the operations of the XY-driving means 7, the dispenser 6, etc.

After the end of the application of the liquid material, the substrate 10 is conveyed by the conveying means 9 to the outside of the apparatus. Then, a next substrate 10 is carried in and the applying operation is repeated on the next substrate 10. In other words, the steps of carrying-in, applying, and carrying-out are performed as one cycle, and the step of applying the liquid material is repeated until the application of the liquid material to the target number of substrates 10 is completed.

Upon reaching the set correction period, the correction of the discharge amount is performed depending on the change in viscosity of the liquid material.

The correction amount is calculated by moving the nozzle 13 to the position above the weight scale 8 by the XY-driving means 7, and by measuring the time required to discharge the liquid material or the weight of the discharged liquid material by using the weight scale 8.

Figure 8:
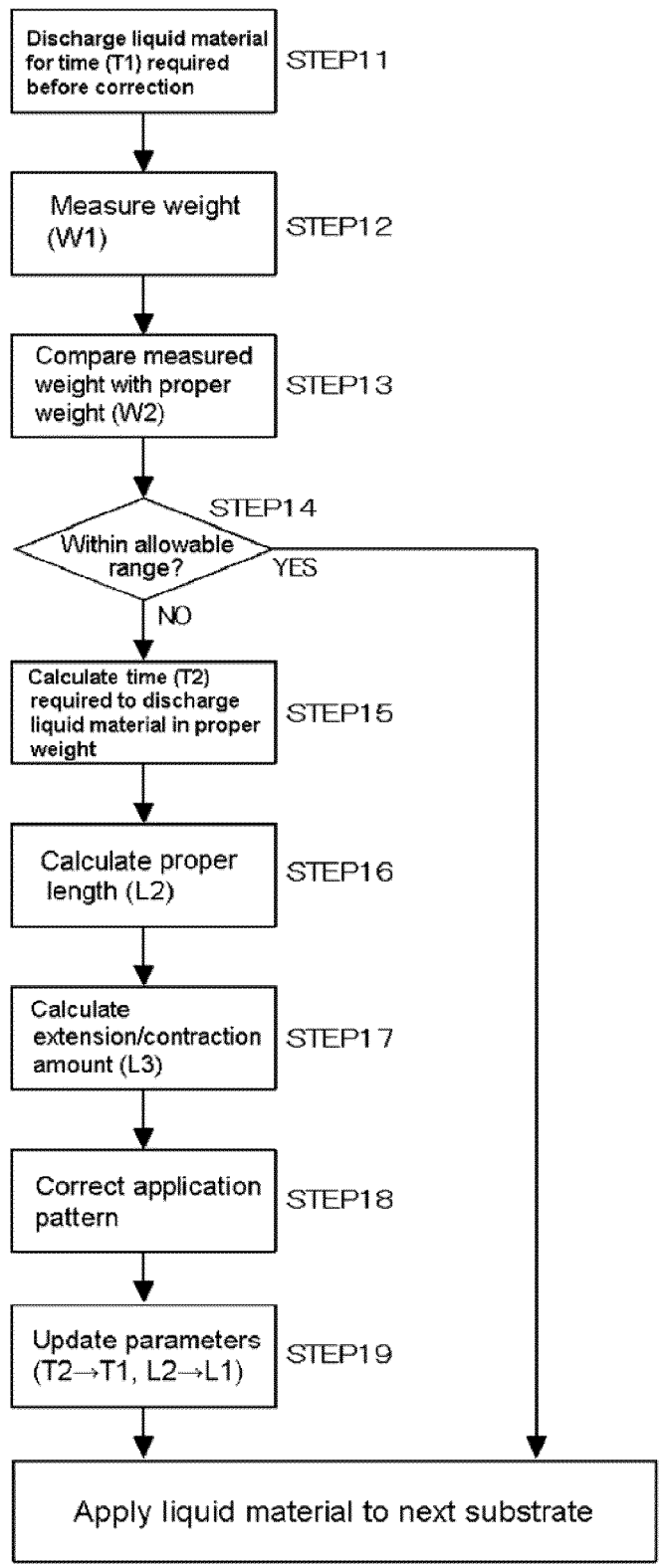
FIG. 8 is a graph to explain correction based on a weight change.

(a) Correction Based on Weight Change (FIG. 8)

The liquid material is discharged from the nozzle 13 for the same time as the time $T_1$ that has been required to form the application pattern on the substrate 10 in the just preceding cycle (STEP 11). The weight $W_1$ of the discharged liquid material is measured by the weight scale 8 (STEP 12). The measured weight $W_1$ is compared with the proper weight $W_2$ that has been previously calculated and stored in the control unit for each application pattern (STEP 13). The necessity of the correction is determined depending on whether the weight difference exceeds the allowable range (STEP 14). If it is determined in STEP 14 that the correction is required, the time $T_2$ required to discharge the liquid material in the proper weight $W_2$ is calculated based on the relationship between the time $T_1$ and $W_1$ (STEP 15). The proper length $L_2$ of the application region 11, i.e., a total value of its length, is calculated (STEP 16) based on the relationship between the time $T_2$ and the speed V. The extension/contraction amount $L_3$ (difference between $L_1$ and $L_2$) is calculated (STEP 17) from both the proper length $L_2$ of the application region 11 in consideration of the plural application strokes in total and the total length $L_1$ of the application region 11 for the substrate in the just preceding cycle. The application region 11 and the non-application region 12 are extended and/or contracted to correct the application pattern (STEP 18). The values of $T_1$ and $L_1$ are updated respectively to $T_2$ and $L_2$ (STEP 19).

The above-described procedures may be modified such that STEP 13 is omitted and STEP 14 is executed after calculating the extension/contraction amount (i.e., after STEP 17).

Figure 9:
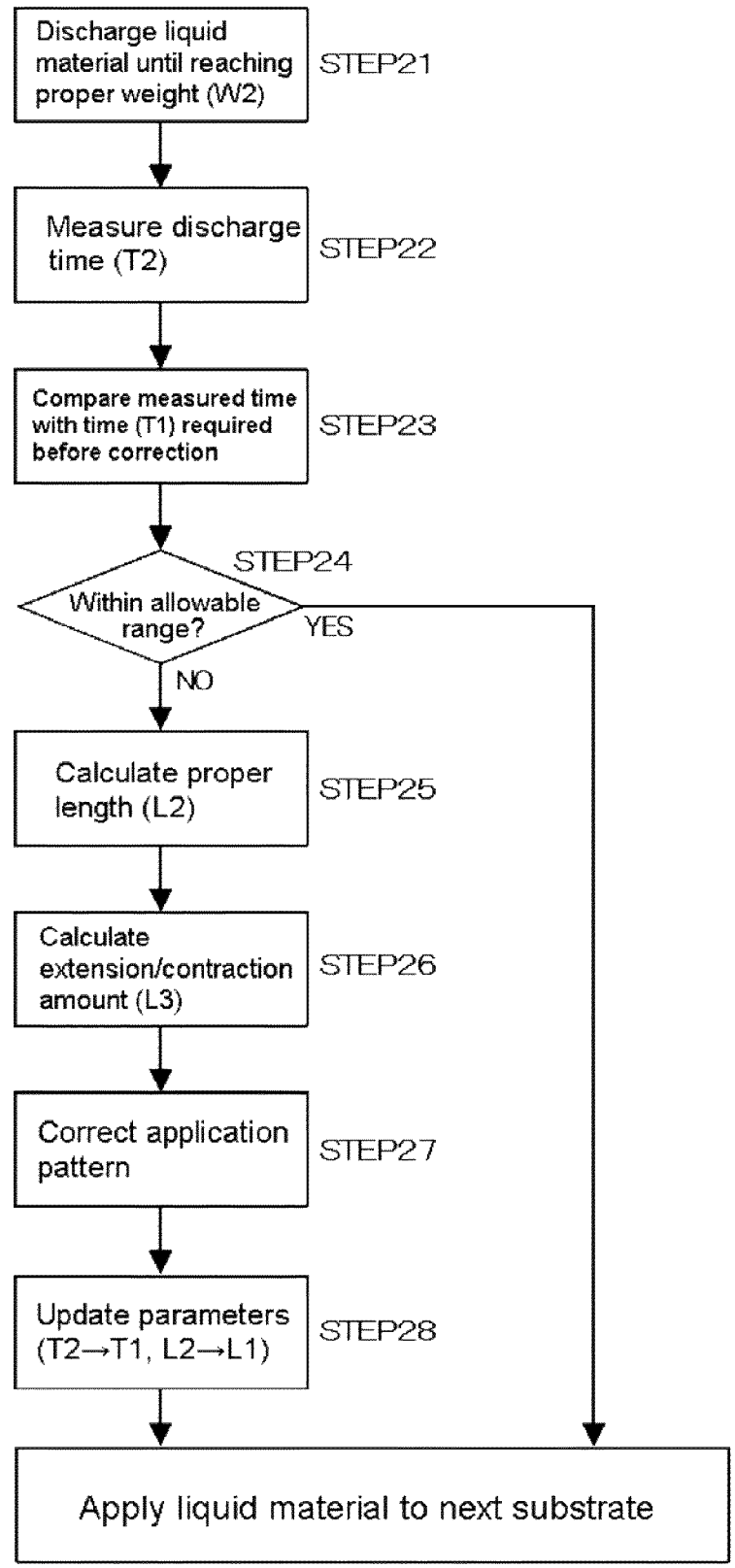
FIG. 9 is a graph to explain correction based on a time change.

(b) Correction Based on Time Change (FIG. 9)

The liquid material is discharged from the nozzle 13 until reaching the proper weight $W_2$ that has been previously calculated and stored in the control unit for each application pattern (STEP 21). The time $T_2$ required for the discharge in the above step is measured (STEP 22). The measured time $T_2$ is compared with the time $T_1$ that has been required to form the application pattern on the substrate 10 in the just preceding cycle (STEP 23). The necessity of the correction is determined depending on whether the measured time $T_2$ exceeds the allowable range (STEP 24). If it is determined in STEP 24 that the correction is required, the proper total length $L_2$ of the application region 11 is calculated (STEP 25) based on the relationship between the time $T_2$ and the speed V. The extension/contraction amount $L_3$ (difference between $L_1$ and $L_2$) is calculated (STEP 26) from both the total length $L_1$ of the application region 11 for the substrate in the just preceding cycle and the proper length $L_2$ of the application region 11. The application region 11 and the non-application region 12 are extended and/or contracted to correct the application pattern (STEP 27). The values of $T_1$ and $L_1$ are updated respectively to $T_2$ and $L_2$ (STEP 28).

In the correction of the application pattern through the above-described procedures, the total length of the application region 11 and the non-application region 12 after the correction is the same between before and after the correction.

When the start and/or end position of the application pattern is located in the non-application region 12, the operation of the XY-driving means 7 may be controlled such that the nozzle 13 is moved only on the application region 11. In such a case, the time during which the nozzle 13 is moved is changed corresponding to the extension/contraction amount $L_3$.

The correction of the application pattern is automatically performed at the set correction period. Stated another way, the applying operation is continued while making the correction at the set correction period until the operation time reaches the limit value of the time over which the liquid material is usable or until the liquid material is exhausted. When the application is first performed after replacing the liquid material, the correction is also preferably performed before executing the application in order to compensate for a variation in quality of the liquid material. On that occasion, the discharging and measuring operations for the correction are no longer required by calculating the correction amount based on the data stored in the control unit, as described above.

Several examples for preparing the application pattern will be described next.

In most cases, the correction of the discharge amount depending on the viscosity change is performed so as to increase the discharge amount because the viscosity increases with the lapse of time. Therefore, the following description is made for the case of increasing the discharge amount.

Basic parameters, such as the length of the application pattern and the moving speed, are decided depending on the weight of the liquid material required to fill the gap between the semiconductor chip 2, i.e., the object onto which the liquid material is to be applied, and the substrate 10, the size of the chip 2, and so on.

FIGS. 3 to 6 are each an explanatory view showing an example of the application pattern, the view looking at a mount surface of the substrate 10 on which the chip 2 is mounted for packaging.

FIG. 3 shows the case that the liquid material is applied to one side of the chip 2. One application pattern is formed by connecting two non-application regions 12 to both ends of one application region 11. Also, the length resulting from adding respective lengths of the application region 11 and the non-application regions 12 together is equal to the length of one side of the chip 2. The change of the extension/contraction amount corresponding to the determined correction amount is performed by extending both the ends or either end of the application region 11 toward the non-application region 12 and by contracting the non-application region 12 in the same amount as the extension amount of the application region 11. At that time, the extension and the contraction are performed such that the total length of the application pattern is not changed.

In the application pattern shown in FIG. 3, the nozzle 13 is not necessarily required to be moved in the non-application region 12. Accordingly, the operation of the XY-driving means 7 may be controlled such that the nozzle 13 is moved only over the application region 11.

Alternatively, the operation of the XY-driving means 7 may be controlled such that the nozzle 13 is moved over the entire length of the application pattern. In such a case, the distance through which the nozzle 13 is moved is equal to the length resulting from adding the respective lengths of the application region 11 and the non-application region 12 after the change. With such control, therefore, the application time is not changed between before and after the correction if the moving speed of the nozzle 13 is not changed and is held constant. That point is similarly applied to any of the later-described cases of FIGS. 4-6.

Figure 4:
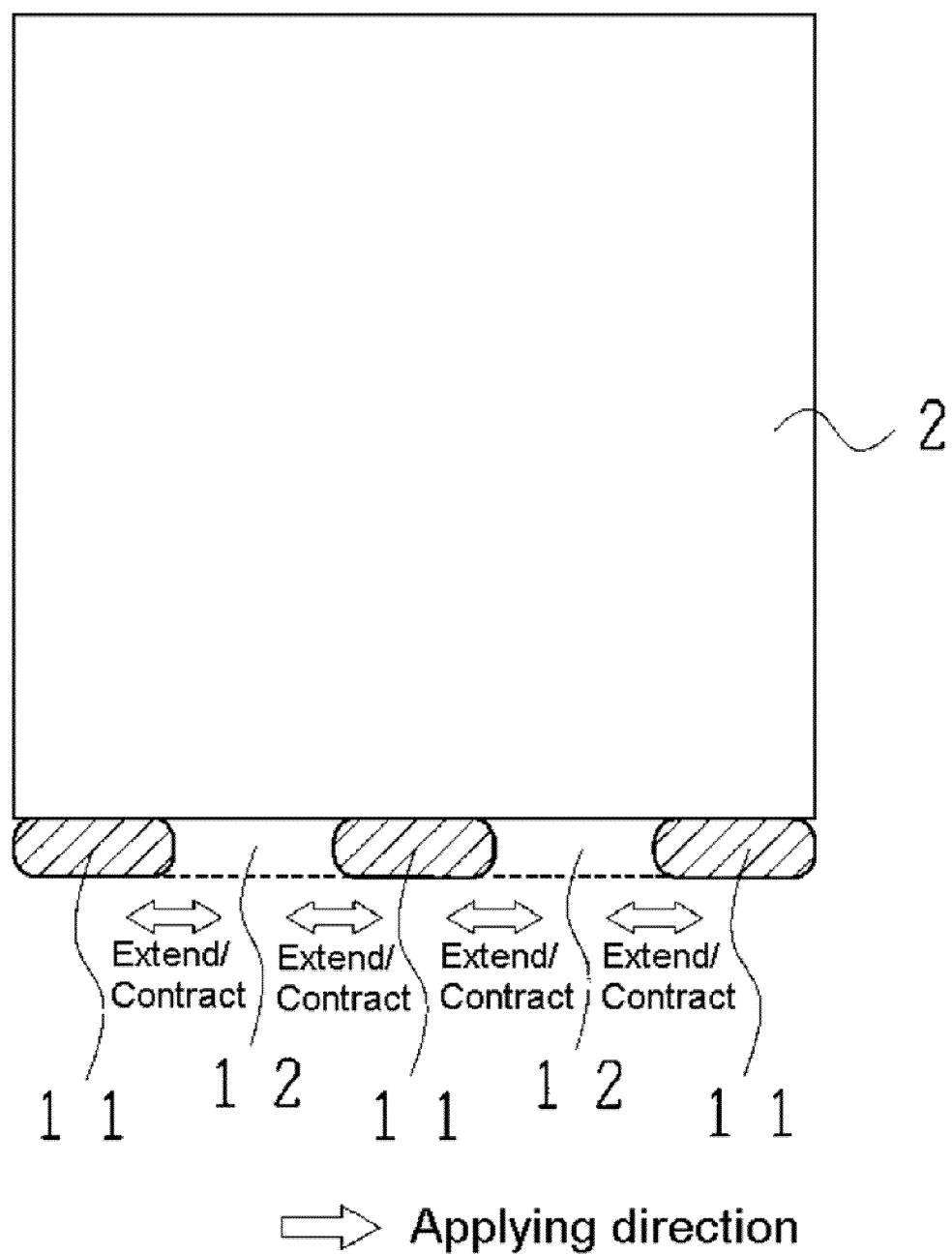
FIG. 4 is an explanatory view illustrating a second example of the application pattern.

FIG. 4 shows the case that one application pattern is formed by dividing the application region 11 into three parts along the one side of the chip 2 and interconnecting those three parts by two non-application regions 12. Also, the length resulting from adding respective lengths of the three application regions 11 and the non-application regions 12 together is equal to the length of one side of the chip 2. In this application pattern, the liquid material can be applied in concentrated fashion to a location where the liquid material is required to be filled in a larger amount. When changing the extension/contraction amount, the two application regions 11 on the right and left sides are extended at their ends closer to the center toward the center, and the centrally located application region 11 is extended at its both ends or either end. The non-application regions 12 are contracted in the same amount as the total extension amount of the application regions 11. As described above, the extension and the contraction are performed such that the total length of the application pattern is not changed.

Although the application regions 11 are drawn as having lengths substantially equal to one another, it is a matter of course that the application regions 11 may have different lengths.

Figure 5:
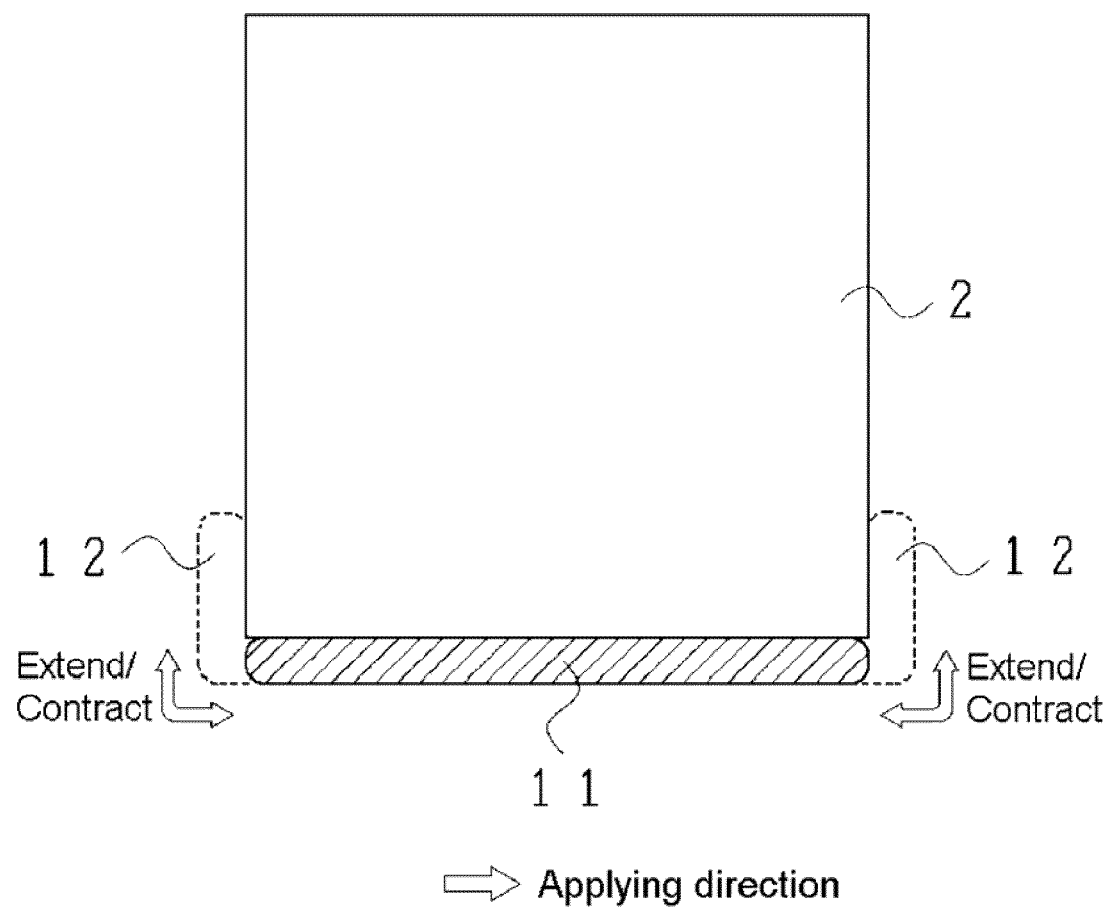
FIG. 5 is an explanatory view illustrating a third example of the application pattern.

FIG. 5 shows an application pattern when the liquid material is required to be filled in a larger amount than those required in FIGS. 3 and 4. The non-application regions 12 are formed as patterns which are each folded to extend along two sides of the chip, which are adjacent to the side 11 to which the liquid material is applied. When changing the extension/contraction amount, the application region 11 is extended at its both ends or either end toward the two or one folded non-application region 12. The two or one non-application region 12 is contracted in the same amount as the extension amount of the application region 11. As described above, the extension and the contraction are performed such that the total length of the application pattern is not changed. Similarly to the case of FIG. 3, the operation of the XY-driving means 7 may be controlled such that the nozzle 13 is moved only over the application region 11.

Figure 6:
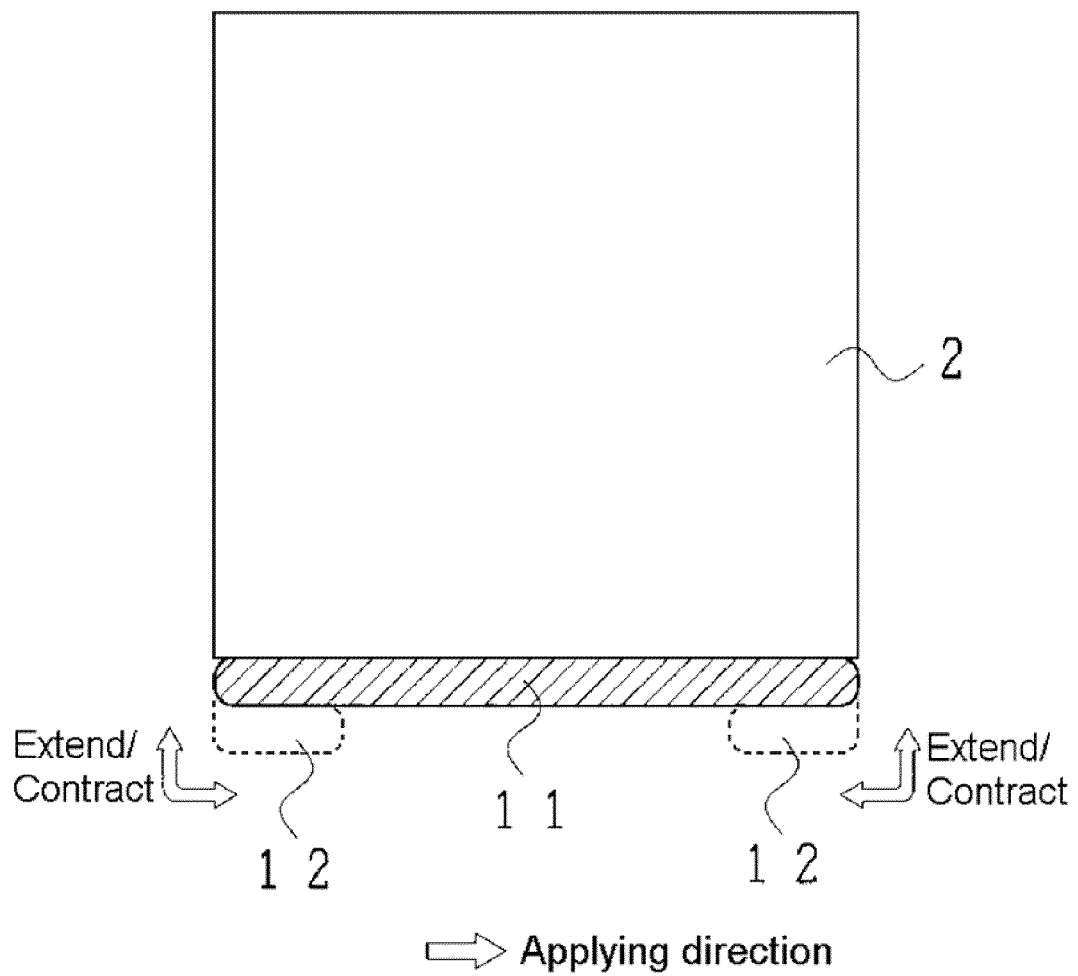
FIG. 6 is an explanatory view illustrating a fourth example of the application pattern.

FIG. 6 shows an application pattern when the discharge amount is required in the same amount as that required in FIG. 5, but spaces along the left and right sides of the chip 2 are not sufficient to apply the liquid material. The non-application regions 12 are formed as patterns which are reversely returned from the both ends of the application regions 11. When changing the extension/contraction amount, the application region 11 is extended at its both ends or either end toward the two or one returned non-application region 12. The two or one non-application region 12 is contracted in the same amount as the extension amount of the application region 11. As described above, the extension and the contraction are performed such that the total length of the application pattern is not changed. Similarly to the case of FIG. 3, the operation of the XY-driving means 7 may be controlled such that the nozzle 13 is moved only over the application region 11.

While the cases of applying the liquid material along one side of the chip 2 have been described with reference to FIGS. 3-6, the present invention can also be applied to the case of applying the liquid material along two sides adjacent to each other in an L-shape, U-shape or along an entire outer periphery of the chip 2.

The dispenser according to the embodiment is not limited to the jet type and it may be the air type discharging the liquid material by using compressed air. When using the air type dispenser, a Z-driving means is preferably mounted between the nozzle 13 and the XY-driving means 7 such that the nozzle 13 can be moved up and down in the vertical direction.

INDUSTRIAL APPLICABILITY

The present invention can be practiced in various types of apparatuses for discharging the liquid material.

The discharge method of the type that the liquid material comes into contact with the work before the liquid material departs from the discharge unit includes, for example, the air type applying air under regulated pressure for a desired time into a syringe which has a nozzle at its distal end, the tubing type including a flat tubing mechanism or a rotary tubing mechanism, the plunger type discharging the liquid material by moving a plunger through a desired distance, which slides while closely contacting an inner surface of a reservoir provided with a nozzle at its distal end, the screw type discharging the liquid material with rotation of a screw, and the valve type controlling discharge of the liquid material, which is pressurized under a desired pressure, by opening and closing a valve.

Also, the discharge method of the type that the liquid material comes into contact with the work after the liquid material has departed from the discharge unit includes, for example, the jet type discharging the liquid material from a nozzle end as a flying stream by striking a valve body against a valve seat, the plunger jet type discharging the liquid material from a nozzle end as a flying stream by moving a plunger-type plunger and then abruptly stopping it, and the ink jet type operating in a continuously jetting mode or an on-demand mode.

The invention claimed is:

1. A liquid material filling method comprising the steps of:
   preparing an application pattern which is extended along an outer periphery of the work and which is made up of an application region and a non-application region;
   correcting a discharge amount of the liquid material by extending or shortening lengths of the application region and the non-application region; and
   discharging a liquid material from a nozzle according to the corrected discharge amount and filling a gap between a substrate and a work placed thereon with the liquid by utilizing a capillary action.

2. The liquid material filling method according to claim 1, wherein the lengths of the application region and the non-application region are extended or shortened without changing a total length of the application pattern.

3. The liquid material filling method according to claim 1, wherein, in the application pattern, the application region and the non-application region are alternately continuously extended.

4. The liquid material filling method according to claim 1, wherein the application pattern has a total length substantially equal to one side of a square work and is made up of one or more application regions and a plurality of non-application regions adjacent to the one or more application regions.

5. The liquid material filling method according to claim 1, wherein the application pattern is made up of an application region having a length substantially equal to one side of a square work and one or two non-application regions which are adjacent to the application region and which are set to extend along a side of the work adjacent to the aforesaid side thereof.

6. The liquid material filling method according to claim 1, wherein the application pattern is made up of an application region having a length substantially equal to one side of a square work and one or two non-application regions which are adjacent to the application region and which are set parallel to each other.

7. The liquid material filling method according to claim 1, wherein a moving speed (V) of a discharge unit is not changed between before and after the discharge amount is corrected.

8. The liquid material filling method according to claim 1, further comprising the steps of measuring weight ($W_1$) of the liquid material discharged during a discharge time ($T_1$) before correction, calculating a time ($T_2$) required to discharge the liquid material in target weight ($W_2$) based on a relationship between the discharge time ($T_1$) and the weight ($W_1$), calculating a proper total length ($L_2$) of the application region from the time ($T_2$) and a moving speed (V) of the discharge unit, and setting a difference between the calculated proper total length ($L_2$) of the application region and a total length ($L_1$) of the application region before the correction as extension/shortening amounts of respective total lengths of the application region and the non-application region.

9. The liquid material filling method according to claim 1, further comprising the steps of discharging the liquid material and measuring a time ($T_2$) until reaching target weight ($W_2$), calculating a proper total length ($L_2$) of the application region from the time ($T_2$) and a moving speed (V) of the discharge unit, and setting a difference between the calculated proper total length ($L_2$) of the application region and a total length ($L_1$) of the application region before the correction as extension/shortening amounts of respective total lengths of the application region and the non-application region.

10. The liquid material filling method according to claim 8, further comprising the steps of:
   storing a relationship between a discharge time or discharge weight and viscosity of the liquid material in a memory, and
   calculating the extension/shortening amounts of respective total lengths of the application region and the non-application region based on information stored in the memory.

11. The liquid material filling method according to claim 8, further comprising the steps of preparing an allowable range used for making determination as to whether the correction is to be performed, and changing the extension/shortening amounts of respective total lengths of the application region and the non-application region for the correction when a measured value exceeds the allowable range.

12. The liquid material filling method according to claim 1, further comprising the step of correcting the discharge amount depending on a change in viscosity of the liquid material over time.

13. The liquid material filling method according to claim 1, wherein the discharge amount of the liquid material is corrected based on time information input as a correction period by a user, the number of works, or the number of substrates.

14. The liquid material filling method according to claim 1, wherein the method is carried out by an application apparatus comprising a liquid material supply unit for supplying a liquid material to be discharged, a measuring unit for measuring a discharge amount of the liquid material, a discharge unit having a discharge port to discharge the liquid material, a driving unit capable of moving the discharge unit, and a control unit for controlling operations of the aforesaid units, wherein the control unit incorporates a computer program for carrying out the liquid material filling method.

15. The liquid material filling method according to claim 1, wherein the method is carried out through a computer program product for use in an application apparatus comprising a liquid material supply unit for supplying a liquid material to be discharged, a measuring unit for measuring a discharge amount of the liquid material, a discharge unit having a discharge port to discharge the liquid material, a driving unit capable of moving the discharge unit, and a control unit for controlling operations of the aforesaid units.

16. The liquid material filling method according to claim 8, wherein the method is carried out by an application apparatus comprising a liquid material supply unit for supplying a liquid material to be discharged, a measuring unit for measuring a discharge amount of the liquid material, a discharge unit having a discharge port to discharge the liquid material, a driving unit capable of moving the discharge unit, and a control unit for controlling operations of the aforesaid units incorporating a computer program for carrying out the liquid material filling method.

17. The liquid material filling method according to claim 8, wherein the method is carried out through a computer program product for use in an application apparatus comprising a liquid material supply unit for supplying a liquid material to be discharged, a measuring unit for measuring a discharge amount of the liquid material, a discharge unit having a discharge port to discharge the liquid material, a driving unit capable of moving the discharge unit, and a control unit for controlling operations of the aforesaid units.

18. A liquid material filling method according to claim 9, wherein the method is carried out by an application apparatus comprising a liquid material supply unit for supplying a liquid material to be discharged, a measuring unit for measuring a discharge amount of the liquid material, a discharge unit having a discharge port to discharge the liquid material, a driving unit capable of moving the discharge unit, and a control unit for controlling operations of the aforesaid units, wherein the control unit incorporates a computer program for carrying out the liquid material filling method.

19. A liquid material filling method according to claim 9, wherein the method is carried out through a computer program product for use in an application apparatus comprising a liquid material supply unit for supplying a liquid material to be discharged, a measuring unit for measuring a discharge amount of the liquid material, a discharge unit having a discharge port to discharge the liquid material, a driving unit capable of moving the discharge unit, and a control unit for controlling operations of the aforesaid units.

* * * * *